United States Patent [19]

Akhtar

[11] Patent Number: 5,066,621

[45] Date of Patent: * Nov. 19, 1991

[54] SEALING GLASS COMPOSITION AND ELECTRICALLY CONDUCTIVE FORMULATION CONTAINING SAME

[75] Inventor: Masyood Akhtar, San Diego, Calif.

[73] Assignee: Johnson Matthey Inc., Valley Forge, Pa.

[*] Notice: The portion of the term of this patent subsequent to May 7, 2008 has been disclaimed.

[21] Appl. No.: 541,605

[22] Filed: Jun. 21, 1990

[51] Int. Cl.$^5$ ............................ C03C 3/12; C09D 5/00
[52] U.S. Cl. ........................................ 501/41; 501/32; 501/46; 501/47; 501/49; 501/51; 106/1.14
[58] Field of Search ...................... 501/41, 46, 47, 49, 501/51, 32; 106/1.14

[56] References Cited

U.S. PATENT DOCUMENTS

| | | | |
|---|---|---|---|
| 4,401,767 | 8/1983 | Dietz et al. | 501/19 |
| 4,436,785 | 3/1984 | Dietz et al. | 428/427 |
| 4,459,166 | 7/1984 | Dietz et al. | 156/89 |
| 4,636,254 | 1/1987 | Husson, Jr. et al. | 106/1.14 |
| 4,761,224 | 8/1988 | Husson, Jr. et al. | 106/1.14 |

*Primary Examiner*—William R. Dixon, Jr.
*Assistant Examiner*—Deborah Jones
*Attorney, Agent, or Firm*—Christie, Parker & Hale

[57] ABSTRACT

Described is a sealing glass composition comprising, in wt. %, 13–50% lead oxide, 20–50% vanadium oxide, 2–40% tellurium oxide, up to 40% selenium oxide, up to 10% phosphorous oxide, up to 5% niobium oxide, up to 20% bismuth oxide, up to 5% copper oxide and up to 10% boron oxide and an electrically conductive formulation comprising, in wt. %, 50–77% silver, 8–34% of a sealing glass composition as described previously, 0.2–1.5% resin and thixotrope and 10–20% organic solvent.

13 Claims, No Drawings

SEALING GLASS COMPOSITION AND ELECTRICALLY CONDUCTIVE FORMULATION CONTAINING SAME

CROSS REFERENCE TO CO-PENDING APPLICATIONS

This application is related to U.S. patent application Ser. No. 07/541,606, Filed June 21, 1990.

BACKGROUND OF THE INVENTION

The present invention relates to sealing glass composition and an electrically conductive mixture of said composition. More particularly, the invention relates to a sealing glass composition for bonding semiconductor chips, also known as "dies", to ceramic substrates and, still more particularly, to a composition useful in bonding such dies to ceramic substrates by firing at temperatures less than 400° C. According to one aspect of the invention, the sealing glass composition is formulated in an electrically conductive paste, such as a silver paste, which is particularly effective to bond silicon semi-conductive devices to ceramic substrates.

It has been known to employ silver-filled glass to bond semi-conductor devices to ceramic substrates which may or may not be metalized. Such pastes are, for example, described in Dietz, et al., U.S. Pat. Nos. 4,401,767, Dietz, et al., U.S. Pat. No. 4,436,785, Dietz, et al., U.S. Pat. No. 4,459,166, Husson, Jr. et al., U.S. Pat. No. 4,636,254 and Husson, Jr. et al., U.S. Pat. No. 4,761,224.

Although the silver paste compositions heretofore known have broad utility in the semi-conductor industry, a problem arises in the use of such compositions in conjunction with semi-conductor devices that cannot withstand the elevated temperature to which the devices may be exposed during bonding of the semi-conductor devices to ceramic substrates. Until now sealing glass compositions and silver paste formulations which have been used required heating at temperatures in excess of 400° C., e.g. 430° C., to effect both satisfactory bonding and development of adequate bonding strength. For example, sealing glasses based on lead borate systems such as been commonly used require firing at 430° C. to produce the desired bond strength. However, many of the new semi-conductor dies are much more sensitive to firing temperature than previous devices and their usefulness is adversely effected by exposure to such temperatures. Dies which are sensitive to elevated firing temperatures include larger dies and dies employing fine line geometry. In the latter case, lines of Si-Si02-Si are spaced 1 to 2 microns apart are provided at the die surface. Firing at high temperature to accomplish satisfactory bonding tends to destroy the usefulness of these dies due to incipient melting of the line compositions which may result in undesirable contact between the lines.

It is therefore desirable to be able to provide a sealing glass composition and silver paste made therefrom which does not require firing at these elevated temperatures to achieve satisfactory bond strength.

SUMMARY OF THE INVENTION

The present invention provides a novel sealing glass composition for bonding semi-conductor devices to ceramic substrates and to electrically conductive formulations of such sealing glass composition which may be also used for bonding purposes. Sealing glass compositions in accordance with the invention enable bonding of the semi-conductor devices to ceramic substrates by firing at temperatures of less than 400° C. while still producing satisfactory bond strength. The composition comprises, in wt. %, 13-50% lead oxide, 20-50% vanadium oxide, 2-40% tellurium oxide, up to 40% selenium oxide, up to 5% niobium oxide, up to 20% bismuth oxide, up to 10% phosphorous oxide, up to 5% copper oxide, and up to 10% boron oxide. A presently preferred composition comprises about 30-50% PbO, about 30-50% $V_2O_5$, about 9-30% $TeO_2$, about 1-5% $Bi_2O_3$, 0-40% $SeO_2$ and up to 10% of one or more of $Nb_2O_5$, $P_2O_5$, CuO, and $B_2O_3$.

In another aspect of the invention there is provided an electrically conductive formulation for bonding semi-conductor devices to ceramic substrates which includes the above-described sealing glass composition in the form of a silver glass paste comprising, in wt. %, 50-77% silver flake which may contain up to 10% silver in powder form, 8-34% of the sealing glass composition described above, and 10-20% of organic material which includes a resin, a thixotrope, and a solvent. The resin and thixotrope may be used interchangeably in amounts of from 0.2-1.5% total. Organic solvent may be present in the range of 10-20%.

DESCRIPTION OF THE PRESENTLY PREFERRED EMBODIMENT

As indicated previously, in accordance with the invention the sealing glass composition useful in formulating electrically conductive paste comprises, in wt. %, 13-50% lead oxide (PbO), 20-50% vanadium oxide ($V_2O_5$, and 2-40% tellurium oxide ($TeO_2$. Optional additives include up to 40% selenium oxide ($SeO_2$), up to 10% phosphorous oxide ($P_2O_5$, up to 5% niobium oxide ($Nb_2O_5$, up to 20% bismuth oxide ($Bi_2O_3$), up to 5% copper oxide (CuO) and up to 10% boron oxide ($B_2O_3$). All percentages as used herein are weight percentages.

The basic glass composition comprises the glass formers, lead oxide (PbO) and vanadium oxide ($V_2O_5$). The desired characteristics of the composition are created by the addition of the other components but the amounts of the PbO and $V_2O_5$ should be in the stated ranges to assure amenability to development of the desired properties by the addition of the other additives. In formulating the composition, the amounts of lead oxide and vanadium oxide and tellurium oxide are selected so that PbO and $V_2O_5$ can interact with the tellurium oxide and the optional additives to result in a mixture capable of producing satisfactorily bond strength even when fired at the desirably low temperature.

Tellurium oxide ($TeO_2$), and selenium oxide ($SeO_2$) which may be substituted in part for the $TeO_2$, both function to increase the fluidity of the glass composition and thus make the glass more reactive with the ceramic substrate to accomplish effective bonding. Tellurium oxide may be used alone or with selenium oxide, but the total should not exceed 40%.

As an optional additive, phosphorous oxide ($P_2O_5$) may be added because of its usefulness in decreasing the melting point of the glass composition in which it is a component. Up to 10% phosphorous penta oxide may satisfy this function without impacting adversely on the firing temperature of the glass.

Niobium oxide ($Nb_2O_5$) may be included in the glass mixture to control the thermal expansion characteristics of the glass so as to avoid an excessive mismatch between the thermal expansion of the glass composition and the ceramic component to which the semi-conductor device is to be bonded. However, the amount of niobium oxide should be controlled to avoid unfavorably impacting on the desirably low firing temperature of the glass composition and thus should be present only in the amounts up to about 5%.

Bismuth oxide ($Bi_2O_3$) increases the wetability of the glass composition on a ceramic substrate. It is also especially useful as an additive with substrates having metallic coatings, e.g. gold, thereon because the bismuth oxide provides improved wetability of the metallic coating on a ceramic substrate. Although glass compositions may be formulated without bismuth oxide if metal coated substrates are not involved, the addition of bismuth oxide renders the glass composition more versatil and capable of broader usage. Up to 20% $Bi_2O_3$ may be present.

Copper oxide (CuO) functions in a manner similar to bismuth oxide in improving the wetting properties of the glass composition on metalized substrates. Thus, copper oxide may be used in amounts of up to 5% for this purpose.

In addition to the foregoing, boron oxide ($B_2O_3$) may also be used to decrease the melting temperature of the glass. Boron oxide may be present in amounts of up to 10% for this purpose.

Still other additives may be included, in addition to the foregoing, within the basic glass composition as long as they do not adversely effect the desirable low firing temperature of the glass composition.

In formulating the silver glass paste in accordance with the invention, the silver component of the mixture should be present in amounts of 50-77%. This silver component provides the electrically conductive characteristics of the paste and is advantageously in the form of silver flake but may contain minor amounts of silver in powder form. The second component of the silver glass paste is the sealing glass composition previously described. It may be present in amounts of 8-34%. This range is selected to achieve optimum bonding strength at the desirably low firing temperatures.

In addition to the foregoing, the third component of the silver glass paste is organic material which generally comprises a mixture of resin, thixotrope and solvent. Combined amounts of resin and thixotrope are in the range of 0.2-1.5% and the solvent may be present in the amounts of about 10-20%.

The resin component of the organic material tends to stabilize the paste and improve flowability. It accomplishes this by coating the glass particles. The thixotrope is used as a defloculator to keep the particles in suspension in the organic solvent. The solvent may be an isoparaffin of any suitable grade such as the "Isopars" sold by Exxon, or mineral spirits.

As indicated previously, either or both a resin and a thixotrope may be used. A suitable thixotrope may be, for example, hydrogenated castrol oil. However, inorganic thixotropes are not useful in the system of the invention. The preferred resin include acrylates and methacrylates such as polymethacrylate and polyethelmethacrylate. The resin component provides viscosity to enable the material to be handled in paste form. The thixotrope also assists in providing the desirable viscosity but may additionally in part somewhat different viscosities resulting in greater thickening effect than the resin would have. The solvent is used is to dissolve the resin and thixotrope. All the organic material, including the solvent thixotrope and resin are volatilized during firing of the silver glass paste to effect bonding of the semiconductor device to the ceramic substrate.

The following examples illustrate the practice of the present invention according to the best mode now contemplated.

A mixture of 71.2% silver flake, 17.8% sealing glass composition and 11% organic materials were mixed together and then heated in a crucible to a temperature of 900° C. The 11% organic component was a mixture of isopar (isoparaffinic hydrocarbon) and thixcin (hydrogenated castor oil); 36.4 wt. % of isopar and 63.4 wt. % of thixcin. After holding for 1.5 hours the resulting molten mixture was quenched in water and a fritted glass product resulted. The fritted glass was dried at 150° C. for 6 hours and thereafter comminuted by a mechanical grinding to less than 325 mesh size. The resulting ground glass was then mixed with the silver flake and organic material. The organic materials comprised a premade mixture of resin, thixotrope and solvent.

To evaluate the effectiveness of the paste in achieving satisfactory ceramic bonding after firing at relatively low firing temperatures, a series of samples of the above described silver paste were prepared and heated to the temperatures and under the conditions set forth in Table 1 below. As can be seen the peak firing temperatures ranged from 300° C. to 420° C. and dies of different size were used. In addition, all samples were heated to temperature at the rate of 10° C. per minute and were held at peak temperature for times of 10 and 15 minutes.

Following heating as described, the samples were permitted to cool normally to room temperature. Bond strengths were tested and the test results also appear in Table 1 which shows the degree of adhesion or "pull strengths" (psi) required to separate the semi-conductor die from the substrate.

TABLE 1

| Peak Temp °C. | Die SIZE Mil$^2$ | Temp Rate °C./min. | Time at peak min. | Adhesion Min. lb. | Adhesion Max lb. | Adhesion Average lb. |
|---|---|---|---|---|---|---|
| 300 | 300 | 10 | 10 | 22.0 | 25.0 | 23.2 |
| 320 | 500 | 10 | 15 | 38.5 | 68.2 | 51.6 |
| 320 | 400 | 10 | 15 | 15.4 | 67.1 | 48.6 |
| 35 | 300 | 10 | 10 | 50.4 | 68.5 | 58.5 |
| 390 | 300 | 10 | 10 | 66.0 | 88.0 | 75.0 |
| 420 | 10 | 10 | 10 | 79.0 | 105. | 91.0 |

As can be seen from the foregoing examples, although bond strengths are greater at higher firing temperature, satisfactory bond strength is achievable with the silver paste formulation in accordance with the invention even at firing temperatures under 400° C.

In another series of examples, samples of the sealing glass compositions described in Table 2 were prepared in the manner previously described. These sealing glass compositions were also formulated into a silver glass paste by mixing with silver flake and organic materials in the proportion of 68% silver flake, 17% sealing glass powder and 15% organic material. The 15 wt. % is the same ratio of organic mixture as described in the previous example. The silver glass paste in these examples was more dilute. In the first case total weight of silver and glass was 89 wt. % and in a later case it was 85 wt. %.

The silver glass paste produced as described herein was placed on an alumina substrate and a silicon die was placed on top of the silver glass paste. The package was heated to a temperature in the range of 320° C. to 350° C. at a heating rate of 10° C. per minute. At the indicated temperature range the package was soaked and held for 15 minutes and thereafter allowed to cool to room temperature under normal conditions.

These samples which were 0.4-inch squares were then tested to determine the bonding strength as in the manner previously described and the results are reported in Table 3 below.

TABLE 2

| Glass # | Composition of the glass by weight % | | | |
|---|---|---|---|---|
| | PbO | V₂O₅ | TeO₂ | Bi₂O₃ |
| 1. | 12.6 | 43.7 | 43.7 | 0.0 |
| 2. | 19.5 | 28.6 | 52.0 | 0.0 |
| 3. | 44.5 | 44.5 | 11.0 | 0.0 |
| 4. | 19.3 | 28.4 | 51.6 | 0.8 |
| 5. | 18.9 | 27.7 | 50.3 | 3.2 |
| 6. | 31.8 | 31.8 | 27.2 | 9.1 |
| 7. | 34.3 | 34.3 | 29.4 | 2.0 |

TABLE 3

| Glass # | Test Temp. °C. | Strength (psi) | | |
|---|---|---|---|---|
| | | Average | Minimum | Maximum |
| 1. | 350 | 36.7 | 25.3 | 44.0 |
| 2. | 350 | 48.7 | 35.2 | 66.0 |
| 3. | 350 | 58.5 | 55.6 | 60.5 |
| 3. | 320 | 51.6 | 38.5 | 68.2 |
| 4. | 320 | 20.5 | 13.2 | 36.3 |
| 5. | 320 | 48.6 | 15.4 | 67.1 |
| 6. | 350 | 62.9 | 41.8 | 72.6 |
| 7. | 350 | 58.5 | 44.0 | 68.2 |

Strength of the above glasses have been also tested on a metalized substrate. The conditions and results are as follows:

| Glass # | Test Temp. °C. | Strength (psi) | | |
|---|---|---|---|---|
| | | Average | Minimum | Maximum |
| 6. | 350 | 50.6 | 35.2 | 57.2 |
| 7. | 350 | 53.7 | 33.0 | 68.2 |

In an additional example, the glass composition as described in Table 4 was prepared and melted in a furnace at 900° C. for about 1.5 hours. It was then quenched in water and dried at 150° C. for 6 hours after which it was ground to powder. This glass composition was then mixed with silver flake and the organic materials, as previously described, to form a paste. The resulting paste was then tested for bond strength, also in the manner previously described, and the results are reported in Table 5.

TABLE 4

| Oxide | Weight % |
|---|---|
| PbO | 49.6 |
| V₂O₅ | 40.5 |
| TeO₂ | 1.4 |
| P₂O₅ | 5.6 |
| Nb₂O₅ | 1.8 |
| Bi₂O₃ | 1.2 |

TABLE 5

| Peak temp. °C. | Temp. rate °C./min. | Soak time min. | Strength (psi) | |
|---|---|---|---|---|
| | | | Low | High |
| 350 | 10 | 15 | 15 | 38 |
| 390 | 10 | 10 | 66 | 80 |
| 420 | 10 | 10 | 79 | 105 |

Once again, it is evident that the sealing glass composition in accordance with the invention and the sealing glass paste produced therefrom, also in accordance with the invention, are capable of establishing satisfactory bond strength even while firing at temperatures less than 400° C.

It is apparent from the foregoing, that the sealing glass composition and silver glass paste of the invention are able to provide satisfactory bonding of semi-conductor devices to ceramic surfaces, that may or may not be metalized. It is also apparent, that various modifications may be made in accordance with the invention without departing from the spirit thereof. For example, any suitable organic solvent, resin and thixotrope may be used to form the paste of the glass composition. Such materials as are known in the field are useful for this purpose since during heating for bonding, the organic material is volatized. In addition, the sealing glass composition of the invention may be used with a variety of ceramic substrates. Although alumina substrates have been shown in the examples described herein, it is also possible to apply the sealing glass paste to bond semiconductor devices to other ceramic substrates such as silicon carbide and silicon nitride.

Accordingly, the scope of the invention should be limited only by the appended claims, wherein what is claimed is:

1. A sealing glass composition comprising, in wt. %, 13-50% lead oxide, 20-50% vanadium oxide, 2-40% tellurium oxide, up to 40% selenium oxide, up to 20% bismuth oxide, up to 10% phosphorous oxide, up to 5% niobium oxide, up to copper oxide and up to 10% boron oxide.

2. A sealing glass composition according to claim 1 wherein tellurium oxide is present in the amount of 9-30%.

3. A sealing glass composition according to claim 1 wherein bismuth oxide is present in the amount of 1-5%.

4. A sealing glass composition according to claim wherein the total amount of niobium oxide, phosphorous oxide, copper oxide and boron oxide does not exceed 10%.

5. A sealing glass composition according to claim 1 wherein the combined amount of tellurium oxide and selenium oxide is in the range of 2-40%.

6. A sealing glass composition comprising, in wt. %, 30-50% lead oxide, 30-50% vanadium oxide, 9-30% tellurium oxide, from 2 to 40% of tellurium oxide and selenium oxide, 1-5% bismuth oxide and up to 10% of one or more of niobium oxide, phosphorous oxide, copper oxide and boron oxide.

7. A silver glass paste suitable for use in bonding a semi-conductor device to a ceramic substrate comprising, in wt. %, 50-77% silver; 8-34% of a sealing glass composition comprising 13-50% lead oxide, 20-50% vanadium oxide, 2-40% tellurium oxide, up to 40% selenium oxide, up to 10% phosphorous oxide, up to 5% niobium oxide, up to 20% bismuth oxide, up to 5% copper oxide, up to 10% boron oxide; 0.2-1.5% resin and thixotrope and 10-20% organic solvent.

8. A silver glass paste according to claim 7 wherein said silver comprises silver in flake form and up to 10% silver in powder form.

9. A silver glass paste according to claim 7 wherein tellurium oxide is present in the sealing glass composition in the amount of 9-30%.

10. A silver glass paste according to claim 7 wherein bismuth oxide is present in the sealing glass composition in the amount of 1-5%.

11. A silver glass paste according to claim 7 wherein the total amount of niobium oxide, phosphorous oxide, copper oxide and boron oxide in the sealing glass composition does not exceed 10%.

12. A silver glass paste according to claim 7 wherein the combined amount of tellurium oxide and selenium oxide is in the sealing glass composition is in the range of 2-40%.

13. A silver glass paste according claim 7 wherein the sealing glass composition comprises, in wt. %, 30-50% lead oxide, 30-50% vanadium oxide, 9-30% tellurium oxide, 2 to 40% total tellurium oxide and selenium oxide, 1-5% bismuth oxide and up to 10% of one or more of niobium oxide, phosphorous oxide, copper oxide and boron oxide.

* * * * *

UNITED STATES PATENT AND TRADEMARK OFFICE
CERTIFICATE OF CORRECTION

PATENT NO. : 5,066,621
DATED : November 19, 1991
INVENTOR(S) : Masyood Akhtar It is certified that error appears in the above-identified patent and that said Letters Patent is hereby corrected as shown below:

Column 2, line 33, change "($V_2O_5$" to -- ($V_2O_5$) --.

Column 2, line 33, change "($TeO_2$" to -- ($TeO_2$) --.

Column 2, line 35, change "($P_2O_5$" to -- ($P_2O_5$) --.

Column 2, line 36, change "($Nb_2O_5$" to -- ($Nb_2O_5$) --.

Column 6, line 41, before "copper" insert -- 5% --.

Column 6, line 49, after "claim" insert -- 1 --.

Signed and Sealed this

Sixth Day of April, 1993

*Attest:*

STEPHEN G. KUNIN

*Attesting Officer*     *Acting Commissioner of Patents and Trademarks*